US007435100B2

(12) United States Patent
Chang et al.

(10) Patent No.: US 7,435,100 B2
(45) Date of Patent: Oct. 14, 2008

(54) SOCKET HAVING STAND-OFFS

(75) Inventors: Chun-Yi Chang, Tu-Cheng (TW); Fang-Jun Liao, Tu-Cheng (TW)

(73) Assignee: Hon Hai Precision Ind. Co., Ltd., Tapei Hsien (TW)

( * ) Notice: Subject to any disclaimer, the term of this patent is extended or adjusted under 35 U.S.C. 154(b) by 0 days.

(21) Appl. No.: 11/724,542

(22) Filed: Mar. 14, 2007

(65) Prior Publication Data

US 2007/0218764 A1 Sep. 20, 2007

(51) Int. Cl.
*H01R 12/00* (2006.01)
*H05K 1/00* (2006.01)

(52) U.S. Cl. .......................................................... 439/66

(58) Field of Classification Search .................. 439/66, 439/74, 862

See application file for complete search history.

(56) References Cited

U.S. PATENT DOCUMENTS

| | | | | |
|---|---|---|---|---|
| 5,308,252 | A * | 5/1994 | Mroczkowski et al. | 439/66 |
| 5,746,607 | A * | 5/1998 | Bricaud et al. | 439/66 |
| 6,866,520 | B2 * | 3/2005 | Chiang | 439/66 |
| 7,186,119 | B2 * | 3/2007 | Perugini | 439/66 |

* cited by examiner

*Primary Examiner*—Javaid Nasri
(74) *Attorney, Agent, or Firm*—Wei Te Chung

(57) ABSTRACT

An connector (1) includes an insulative housing (2), and a multiplicity of conductive contacts (3) received in the housing. The housing comprises a mating surface (20) and a mounting surface (21) opposite to the mating surface. The housing defines a plurality of passageways (23) extending vertically therethrough to receive corresponding contacts therein. A seriate stand-offs (24) extends from the two opposite lateral sides of the adjacent passageways on the mounting surface.

3 Claims, 3 Drawing Sheets

SOCKET HAVING STAND-OFFS

BACKGROUND OF THE INVENTION

1. Field of the Invention

The present invention relates to the art of electrical connectors, and more particularly to an connector for electrically connecting an electronic package such as an central processing unit (CPU) with a circuit substrate such as a printed circuit board (PCB).

2. Background of the Invention

An electrical connector, widely used in the connector industry for electrically connecting a CPU to a PCB, mainly comprises an insulative housing and a multiplicity of conductive contacts. The housing comprises a multiplicity of passageways defined therein in a generally rectangular array, for interferentially receiving corresponding conductive contacts.

In use, one surface of housing is mated to a PCB, with solder balls of the contacts electrically connected with the PCB. A CPU is mounted to the other surface of the housing, with contacting portions of the contacts electrically connected with the pads of CPU. The electrical connector thus electrically connects the CPU with the PCB via contacts. A force is applied to press the CPU downwardly in order that the contacting portions firmly electrically connect with the pads of CPU. The contacts tend to twist under the force, at the same time, a horizontal force comes into being. The horizontal force is proportion to the number of conductive contacts. With the developments to reduce sizes of electronic equipments, particularly personal portable devices, with additional functions to such equipments, has resulted in an ongoing trend for miniaturization of all components, especially electrical connectors, on the contrary, the developments have created a great demand for contacts, so a total of cumulative horizontal force become larger and larger. The total of cumulative horizontal force easily break the side-walls of the passageways.

A conventional connector comprises an insulative housing, and a multiplicity of conductive contacts received in the housing. The housing comprises a mating surface and a mounting surface opposite to the mating surface. The housing defines a plurality of passageways extending vertically therethrough to receive corresponding contacts therein. A top protrusions extends integrally upwardly from the mounting surface. The top protrusion is adapted to uphold the CPU when the CPU is secured in the passageway of the housing. In order to facilitate said upholding, the top protrusion has a generally L-shaped profile with a smooth top mounting surface to support said CPU, and extends from a lateral side of passageway adjacent another. Thereby the CPU can steadily sit on the protrusions, nevertheless, when the number of the contacts is very large, side-walls of adjacent passageways are easily cracked.

Therefore, there is a heretofore unaddressed need in the industry to address the aforementioned deficiencies and inadequacies.

SUMMARY OF THE INVENTION

An object of the present invention is to provide an electrical connector for electrically connecting an electrical package with a circuit substrate, whereby the electrical connector is configured to minimize the risk of accidental damage to the side-walls of the passageways.

Another object of the present invention is to provide an electrical connector configured so that contacts of the connector can accurately engage with the associated electronic package.

To achieve the above objects, an electrical connector in accordance with a preferred embodiment of the present invention is for connecting a CPU with a PCB. The connector includes an insulative housing, and a multiplicity of conductive contacts received in the housing. The housing comprises a mating surface and a mounting surface opposite to the mating surface. The housing defines a plurality of passageways extending vertically therethrough to receive corresponding contacts therein. A grid of stand-off extending across the mounting surface.

Other features and advantages of the present invention will become more apparent to those skilled in the art upon examination of the following drawings and detailed description of preferred embodiments, in which:

DETAILED DESCRIPTION OF ILLUSTRATIVE EMBODIMENT

Figure 1:
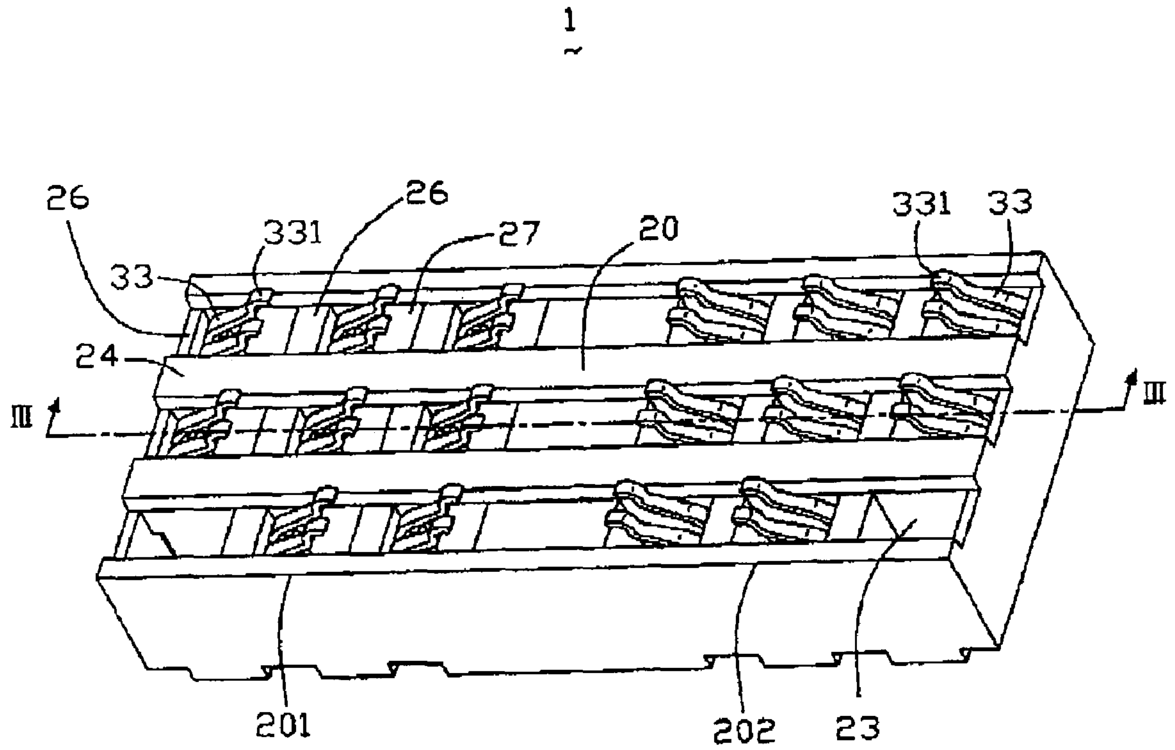
FIG. 1 is an exploded, isometric view of an electrical connector in accordance with a preferred embodiment of the present invention, together with two contacts out of a socket body.
Figure 2:
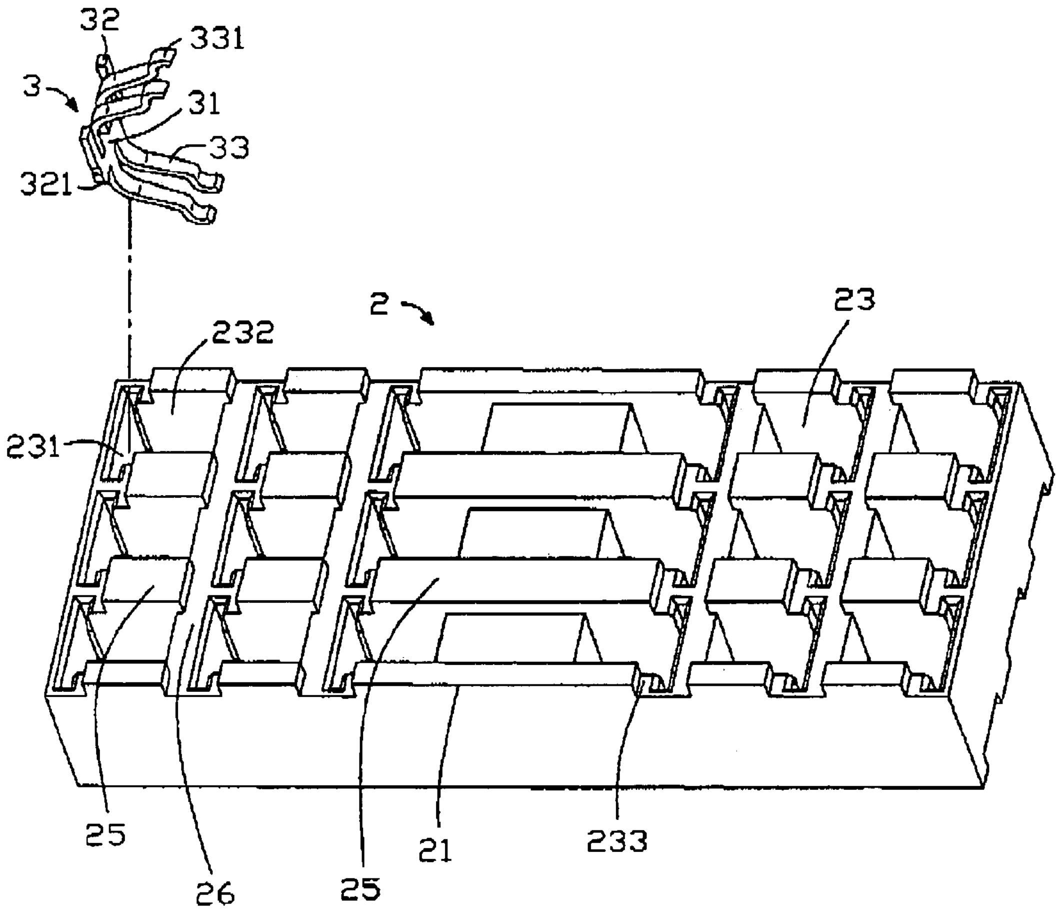
FIG. 2 is a reversed, isometric view of FIG. 1.

Referring to FIGS. 1 to 2, an electrical connector 1 in accordance with a preferred embodiment of the present invention includes an insulative housing 2 and a multiplicity of conductive contacts 3 received in the housing 2.

The housing 2 having rectangular configuration defines a first conduction district 201 and a second conduction district 202 along a longitudinal direction for electrically connecting a CPU to a PCB. The first and second conduction district comprises a mating surface 20 for the CPU and a mounting surface 21 opposite to the mating surface 20 for the PCB. A plurality of passageways 23 extending vertically through the mating and mounting surfaces to received corresponding contacts 3 therein. The passageways 23 are arranged in a rectangular array of rows and columns and each have end walls 26 and lateral walls 27. In addition, a sedate stand-offs 24 extends upward from the lateral walls 27 of the passageways 23 on the mating surface 20 an incontinuous stand-off 25 extend from the lateral wall 27 of the passageways 23 on the mounting surface 21.

The plurality of contacts 3 are used in an electrical connector 1 for electrically connecting a first electrically interface, such as leads of an electrical package to a second electrical interface, such as circuit paths on a printed circuit board. The contact 3 is preferably stamped from a sheet of conductive metallic material, and has a substantially symmetric C-shaped profile. The contact 3 comprises a vertical retention portion 31, two spring arms 33 obliquely extending from two opposite sides of the retention portion 31, respectively, and a contacting portion 331.

The retention portion 31 has a planar configuration. An upper section and a lower section of the retention portion 31 are bifurcated respectively by the two spring arms 33. A pair of vertical opposite locating sections 32 thereby are formed coplanarly on the retention portion 31. Two barbs 321 protrude outwardly from a lower lateral side edge of each of the locating sections 32.

As shown more clearly in FIG. 2, each passageways 23 extends through the housing 2 from the mating surface 20 to the mounting surface 21 thereof, and is configured with a generally T-shaped profile. Each passageway 23 has a board retaining slot 231 on the end wall 26 thereof and a narrow, along a transverse direction perpendicular to the longitudinal direction, receiving cavity 232 in communication with one end of the retaining slot 231. The retaining slots 231 do not Run through the mating surface 20 (clearly seen in FIG. 1) and the receiving cavities 232 run Through the mating surface 20. Thus, the contact 3 is firmly retained in the passage way 23. Combined with FIG. 3, the retention portions 31 are retained in the retaining slot 231 with the locating sections 32 and the barbs 321 interferingly engaging with the housing when the contacts are assembled into the passageways 23 from the mounting surface 21. The spring arms 33 communicate in the receiving cavities 232 and contacting portions 331 slantwise extend beyond the mating and mounting surface. The stand-offs 24, 25 are arranged for avoid the spring arms and contacting portions from damage, for example, the contacting portions abut against the end walls while the contacts are compressed.

Figure 3:
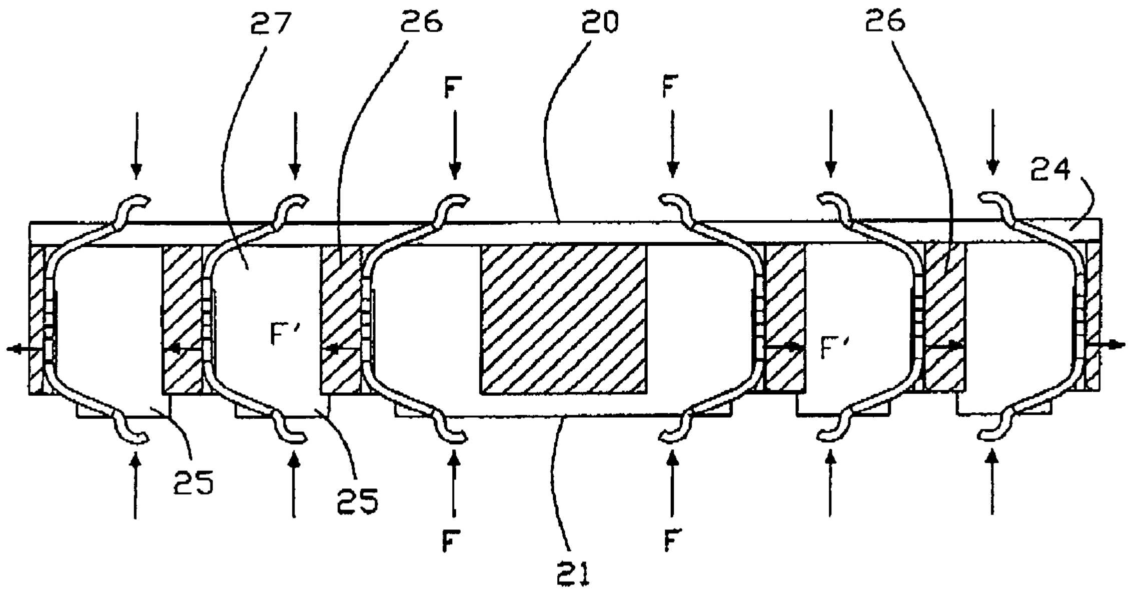
FIG. 3 is a cross-section view taken along line III-III of FIG. 1, wherein a force is applied to press the CPU downwardly.

Referring to FIG. 3, in use, the connector 1 is sandwiched between the CPU and the PCB. Exterior force F is provide to press the CPU and the PCB to close toward each other until the CPU stand on the upper serial stand-offs 24 and the traces of the PCB touch on the stand-offs 25. Horizontal forces F' press against the end walls 26 and the lateral walls 27 bears an outward force. Combined with FIG. 1, the stand-offs 24 integrally extend upwards beyond the end walls 26 and each is uninterrupted along and extending substantially along the entire length of the lateral wall 27 of the conductive district, such as the first conduction district 201 or the second conduction district 202. In nreferred embodiment each stand-off 24 are uninterrupted along the entire length of the housing, namely the stand-off 24 runs throuah the whore conduction district. The the serial stand-offs 24 strengthen the integrated intensity of the lateral walls 27 of the passageways, so the horizontal force F' can not easily destroyed the lateral walls 27 of the passageways 23. The incontinuous stand-offs 25 are divided by the rows of the passageways 23 since the contacts are upwardly assembled.

While the present invention has been described with reference to illustrative embodiments, the description of the invention is illustrative and is not to be construed as limiting the invention. Various of modifications to the present invention can be made to illustrative embodiments by those skilled in the art without departing from the true spirit and scope of the invention as defined by the appended claims.

What is claimed is:

1. An electrical connector comprising: an insulative housing; a multiplicity of conductive contacts; the housing defining with a conductive district for electrically connecting with a CPU and a PCB; the conductive district comprising a mating surface and a mounting surface opposite to the mating surface; a plurality of passageways extending vertically through said conductive district to receive corresponding contacts therein; and the contact imposing a force in a direction against a first wall face beside the passageway when the contact is downwardly pressed; wherein for each of said passageways, a pair of stand-offs vertically extend respectively from a pair of second wall faces which are located by two sides of the first wall face, and also along the direction horizontally; wherein the pair of stand-offs are not connected to but isolated from the pair of neighboring stand-offs in said direction, and no stand-off extends along another horizontal direction perpendicular to said direction so that no stand-off is formed along the first wall; wherein each contact comprises a vertical retention portion retained in the first wall of the passageway, a pair of spring arms obliquely extending from two opposite sides of the retention portion, respectively; wherein each side of the retention portion extends two parallel spring arms.

2. An electrical connector adapted for connecting a CPU to a PCB, comprising: an insulative housing defining a conduction district, the conduction district defining a mating surface for the CPU, a mounting surface opposite to the mating surface for the PCB and a plurality of passageway arranged in an array and running though the mating and mounting surfaces; a multiplicity of contacts received in the passageways; each passageway defining opposite lateral walls and opposite end walls and the contact being retained in the end wall; wherein a stand-off integrally extends upwards from each lateral wall beyond the end wall and is uninterrupted along the entire length of the conduction district;

wherein each contact comprises a vertical retention portion retained in the end wall of the passageway, a pair of spring arms obliquely extending from two opposite sides of the retention portion, respectively;

wherein each side of the retention portion extends two parallel spring arms;

wherein said conductive district is divided into a first conductive district and a second conductive district respectively with said array of said passageways;

wherein the contacts located in the first conductive district are oriented in a first common direction opposite to the conductive contacts located in the second conductive district;

wherein the contacts are assembled into the passageways from the mounting surface;

wherein said stand-off extends from each lateral wall beyond the end wall on the mounting surface and is interrupted along the entire length of the conduction district.

3. The electrical connector as recited in claim 2, wherein the stand-off is parallel to a plane formed by the pair of the spring arms of the contacts.

* * * * *